United States Patent [19]

Kuroda

[11] Patent Number: 4,831,575
[45] Date of Patent: May 16, 1989

[54] APPARATUS FOR CONVERSION BETWEEN IEEE STANDARD FLOATING-POINT NUMBERS AND TWO'S COMPLEMENT FLOATING-POINT NUMBERS

[75] Inventor: Ichiro Kuroda, Tokyo, Japan

[73] Assignee: NEC Corporation, Tokyo, Japan

[21] Appl. No.: 1,910

[22] Filed: Jan. 9, 1987

[30] Foreign Application Priority Data

Jan. 9, 1986 [JP] Japan .................................. 61-2444

[51] Int. Cl.$^4$ ........................... G06F 7/38; H03M 7/00
[52] U.S. Cl. ...................................... 364/748; 341/50
[58] Field of Search ................. 364/748; 340/347 DD

[56] References Cited

PUBLICATIONS

W. Cody et al., "A Proposed Radix and Word-Length-Independent Standard for Floating-Point Arithmetic", IEEE Micro, vol. 4, #4, Aug. 1984, pp. 86–100.
"A Proposed Standard for Binary Floating-Point Arithmetic", Introductory Comments by David Stevenson, Chairman, Floating Point Working Group Micropocessor Standards Committee, IEEE Computer Society, 1981.
"A Floating Point Format For Signal Processing", TRW LSI Products, La Jolla, CA, 1982, Dr. John A. Eldon, Craig Robertson.

*Primary Examiner*—Gary V. Harkcom
*Assistant Examiner*—Long T. Nguyen
*Attorney, Agent, or Firm*—Foley & Lardner, Schwartz, Jeffery, Schwaab, Mack, Blumenthal & Evans

[57] ABSTRACT

An apparatus for conversion between IEEE standard floating-point numbers and two's complement floating-point numbers provides a specialized circuit for high-speed two-way conversion between the IEEE standard floating-point format and the two's complement floating-point format. The apparatus eliminates problems that occur when the conversion is performed by a computer program.

2 Claims, 3 Drawing Sheets

ROTATE LEFT SHIFT

→ IF/S=1, CALCULATION OF TWO's COMPLEMENT

SUBTRACTION OF 127          1-BIT LEFT SHIFT

2-BIT CORRECTION

ADDITION OF 127          CALCULATION OF ABSOLUTE VALUE

ROTATE RIGHT SHIFT

1-BIT LEFT SHIFT

1-BIT CORRECTION

APPARATUS FOR CONVERSION BETWEEN IEEE STANDARD FLOATING-POINT NUMBERS AND TWO'S COMPLEMENT FLOATING-POINT NUMBERS

BACKGROUND OF THE INVENTION

The present invention relates to an apparatus for the conversion of IEEE standard floating-point numbers into two's complement format floating-point numbers or vice versa.

A numerical value or data used in scientific or technical calculation is expressed in a floating-point number consisting of an exponent e and a mantissa m. A numerical value f having a base b can be represented by Equation (1) below.

$$f = m \times b^e \qquad (1)$$

Equation (1) permits the expression of a wide range of numerical values in a limited number of bits.

A typical floating-point format is the standard format proposed by the Institute of Electrical and Electronics Engineers (IEEE). This format is used in many microcomputers. The 32-bit floating-point format standardized by IEEE has the following features. As illustrated in FIG. 1, the format consists of a sign bit S, an eight-bit exponent E and a 23-bit mantissa M. The exponent is expressed in a biased form, wherein 127 is added to the real value of the exponent, and the mantissa is expressed in its absolute value and can represent a number within the range of Equation (2).

$$1 \leq f < 2 \qquad (2)$$

Since, however, the most significant bit (MSB) of the normalized number is always "1", the MSB is omitted, and the number is expressed from the second most significant bit on.

The case in which the value of the exponent is at its maximum, 127, is specially treated as a non-number, and the case in which the value of the exponent is at its minimum, 0, is exceptionally treated as a denormalized number. For further details, reference may be made to "A Proposed Standard for Binary Floating-Point Arithmetic", Draft 8.0 of IEEE Task P754, 1981.

Along with the IEEE standard format referred to above, there is also used a floating-point format, in which both the exponent and the mantissa are expressed in two's complement representation.

For instance, a floating-point arithmetic processor manufactured by TWR LSI Products uses floating-point numbers using the two's complement format. For details on this format, reference may be made to John A. Eldon et al., "A Floating-Point Format for Signal Processing", Proceedings of the 1982 IEEE International Conference on Acoustics, Speech and Signal Processing, pp. 717-720. Whereas the article proposes a 22-bit floating-point format, the 22 bits consist of six exponent bits and 16 mantissa bits, there can also be conceived, as an expansion of the 22-bit format, a 32-bit floating-point format using an eight-bit exponent and a 24-bit mantissa, both expressed in two's complement representation, as shown in FIG. 2. This shall hereinafter be called the two's complement 32-bit floating-point format.

However, when data processed in the two's complement 32-bit floating-point format are to be used by a computer conforming to the IEEE standard format or vice versa, conversion is required between the two different formats of expression. Though the format conversion may be achieved by a program combining bit processing and arithmetic processing, it would entail the problem of requiring a large number of steps.

SUMMARY OF THE INVENTION

An object of the present invention, therefore, is to provide a specialized circuit for facilitating high-speed two-way conversion between the above-mentioned IEEE standard floating-point format and the two's complement floating-point format.

A floating-point format converter according to the invention performs format conversion between a first floating-point format data consisting of one sign bit, an e-bit biased exponent, and an (m−1)-bit absolute-value mantissa and a second floating-point format data consisting of an e-bit two's complement exponent and an m-bit two's complement mantissa. This converter includes a control signal generator for generating a first control signal for indicating conversion from the first floating-point format data to the second floating-point format data; an input register for storing the first floating-point format data; first means, responsive to the first control signal, for generating a shifted exponent by rotate-shifting leftward by one bit the e+1 upper bits of the first floating-point format data; a subtractor, responsive to the first control signal, for generating a corrected exponent by subtracting a predetermined number from the e bits of said shifted exponent; second means, responsive to the first control signal, for generating a converted exponent e+1 bits, including the least significant bit (LSB) of the shifted exponent, and the e bits of the corrected exponent; a mantissa converter, responsive to the first control signal and the value of the LSB of the corrected exponent, for converting the m lower bits of the first floating-point format data to the mantissa of the two's complement format; third means, responsive to the first control signal, for generating a shifted mantissa by shifting rightward by one bit the mantissa of the two's complement format; and a bit correcting circuit, responsive to the first control signal and the value of the LSB of the shifted exponent, for generating a converted exponent by correcting the two upper bits of the shifted mantissa.

A floating-point format converter according to the present invention may also comprise a control signal generator for generating a second control signal for indicating conversion from the second floating-point format data to the first floating-point format data; an input register for storing the second floating-point format data; first means, responsive to the second control signal, for supplying as a shifted exponent the e+1 upper bits of the second floating-point format data; an adder, responsive to the second control signal, for generating a corrected exponent by adding a predetermined number to the e bits of the shifted exponent; second means, responsive to the second control signal, for generating a converted exponent by rotate-shifting rightward by one bit the e+1 bits including the LSB of the shifted exponent and the e bits of the corrected exponent; a mantissa converter, responsive to the second control signal and the value of the LSB of the corrected exponent, for converting the m least significant bits of the second floating-point format data to the mantissa of the two's complement format; third means, responsive to the second control signal, for generating a shifted mantissa by shifting leftward by one bit the mantissa of the two's complement format; and a bit correcting circuit, responsive to the second, control signal for generating a converted exponent by correcting the most significant bit of the shifted mantissa.

BRIEF DESCRIPTION OF THE DRAWINGS

The above and other objects, features and advantages of the present invention will become apparent from the following detailed description when taken in conjunction with the accompanying drawings in which.

DESCRIPTION OF THE PREFERRED EMBODIMENT

Figure 3:
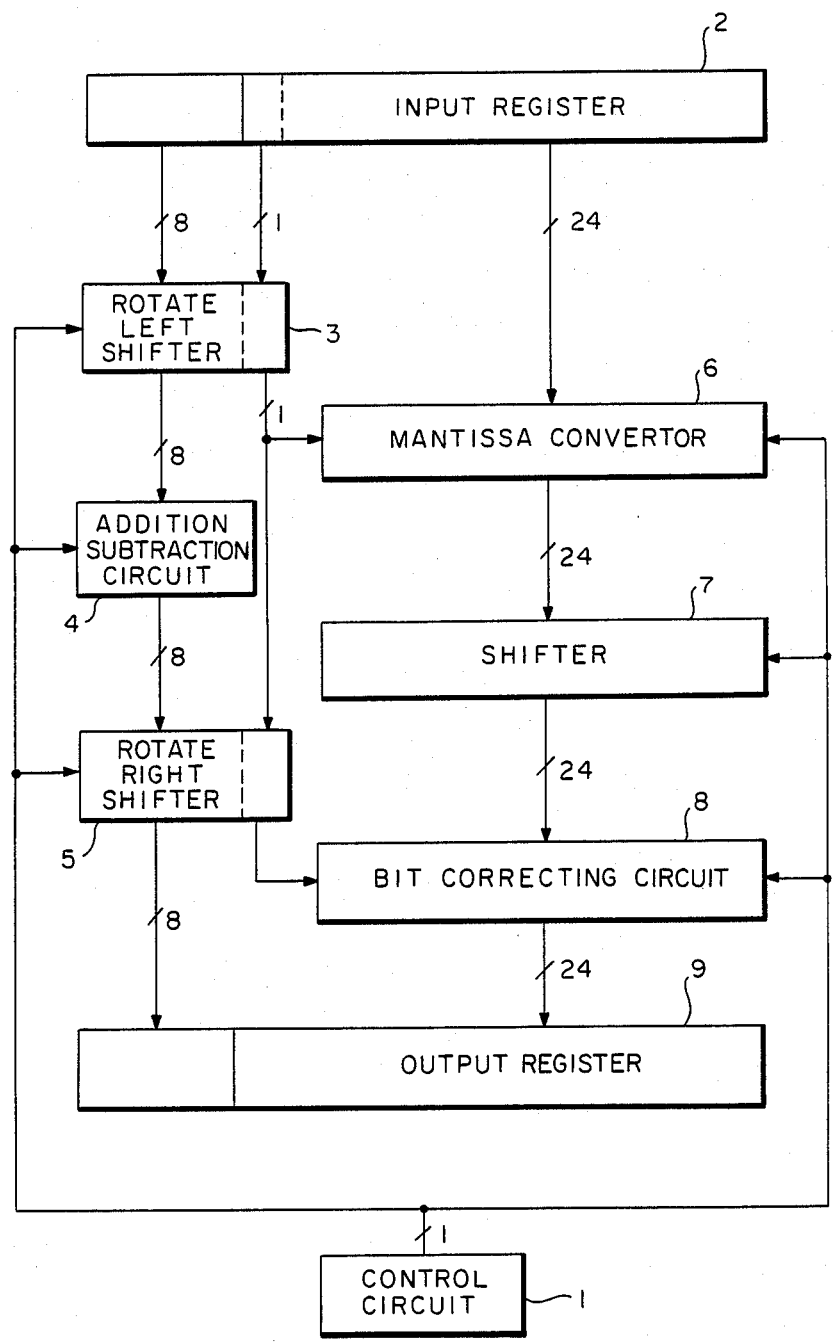
FIG. 3 is a block diagram illustrating one preferred embodiment of the present invention.

FIG. 3 is a block diagram illustrating one preferred embodiment of the present invention. A floating-point format converter according to the present invention has an input register 2 to store a 32-bit floating-point number to be converted. A shifter 3 shifts the nine upper bits from the input register 2 in response to a conversion indicating signal supplied from a control circuit 1. More specifically, the shifter 3, when the conversion indicating signal indicates conversion from the IEEE floating-point format to the two's complement floating-point format (I/T conversion), rotate-shifts the nine upper bits leftward by one bit, or when the conversion indicating signal indicates conversion from the two's complement floating-point format to the IEEE floating-point format (T/I conversion), outputs the nine upper bits as they are. An addition/subtraction (A/S) unit 4 subtracts decimal 127 from or adds decimal 127 to the eight upper bits of the output of the shifter 3 in a hexadecimal expression in response to the I/T or the T/I conversion indicating signal. To a shifter 5 are inputted nine bits consisting of the eight-bit output of the A/S unit 4 and the least significant bit (LSB) of the output of the shifter 3. This shifter 5, when the conversion indicating signal indicates I/T conversion, outputs the input data as they are, or when the conversion indicating signal indicates T/I conversion, performs a rotate-shift rightward by one bit. A mantissa converter 6, when I/T conversion is indicated and when the LSB of the output of the shifter 3 is "1", outputs the two's complement of the 24 lower bits received from the input register 2, or when I/T conversion is indicated and the LSB of the output of the shifter 3 is "0", outputs the inputted 24 bits as they are.

The mantissa converter 6 responds to the T/I conversion indicating signal by outputting the absolute value of the inputted 24 bits. A shifter 7 shifts the output of the mantissa converter 6 by one bit rightward when I/T conversion is indicated, or leftward when T/I conversion is indicated.

A bit correcting circuit 8 replaces the two upper bits of the output of the shifter 7 with "01" when I/T conversion is indicated and the LSB of the output of the shifter 5 is "0", or with "10" when I/T conversion is indicated and the LSB of the output of the shifter 5 is "1". The bit correcting circuit 8 replaces the MSB of the output of the shifter 7 with the LSB of the output of the shifter 5 in response to a T/I conversion indicating signal.

In an output register 9 is stored the 32-bit data converted into the desired format, comprising the eight upper bits of the output of the shifter 5 and the 24-bit output of the bit correcting circuit 8.

Figure 4:
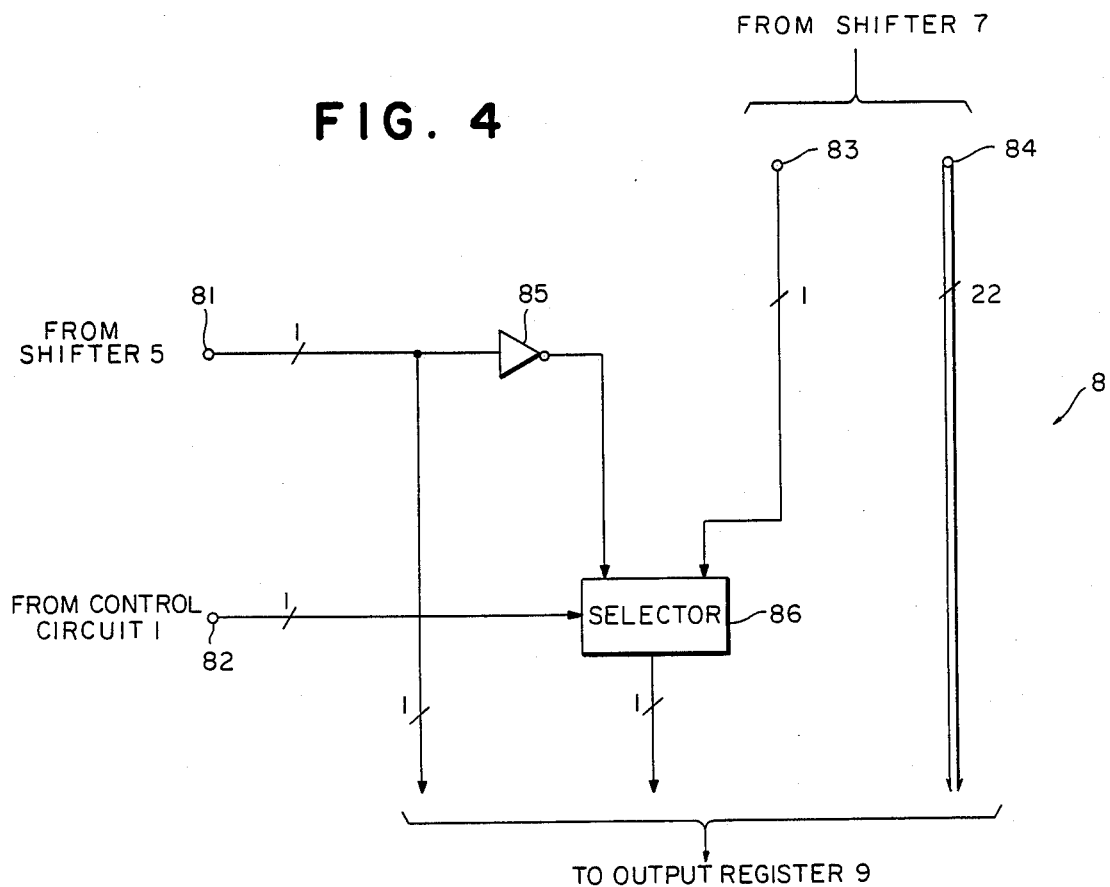
FIG. 4 is a circuit diagram illustrating one example of a bit correcting circuit.

FIG. 4 is a circuit diagram illustrating one example of the bit correcting circuit 8. An inverter 85 inverts the LSB received from the shifter 5 via a terminal 81 and feeds the inverted bit to a selector 86. The selector 86 selects an input from inverter 85 when the conversion indicating signal indicates a I/T conversion, or from the second bit of the shifter 7 supplied from a terminal 83, when T/I conversion is indicated.

Figure 1:
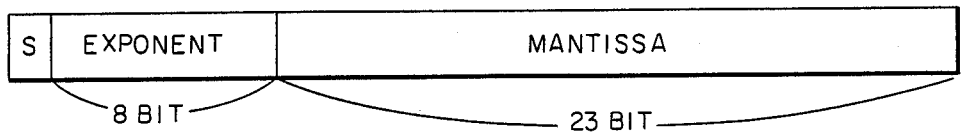
FIG. 1 illustrates the IEEE standard 32-bit floating-point format.
Figure 2:
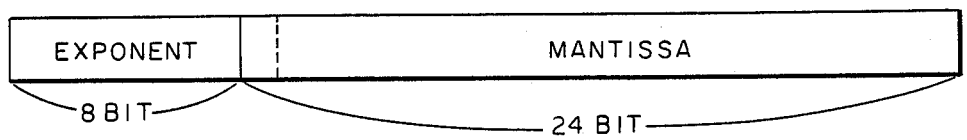
FIG. 2 illustrates the two's complement 32-bit floating-point format.
Figure 5A:
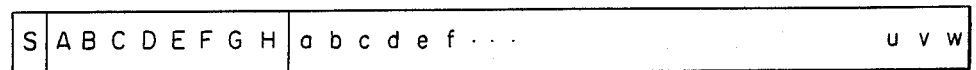
FIGS. 5A to 5E and FIGS. 6A to 6F are diagrams for describing the operation of the converter according to the invention.
Figure 5B:
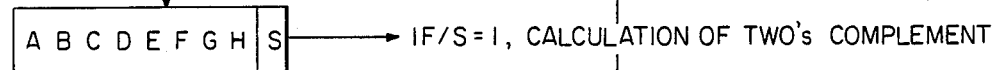

Next, the operation of the floating-point format converter will be described. First, an I/T conversion will be described with reference to FIGS. 5A to 5E. An I/T conversion indicating signal is supplied from the control circuit 1 to the structural elements 3 to 8, and an IEEE standard 32-bit floating-point number or data, as shown in FIG. 1, is entered into the input register 2 (FIG. 5A). The shifter 3 receives the single sign bit S and the eight-bit exponent (A . . . H) from the input register 2, and shifts them leftward by one bit in response to the I/T conversion indicating signal (FIG. 5B). The A/S unit 4 subtracts decimal 127 from the shifted exponent, and provides an exponent (FIG. 5E) in the two's complement floating-point format shown in FIG. 2.

Figure 5C:
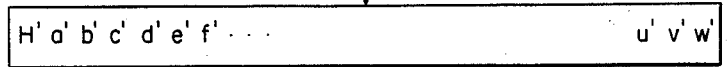

Meanwhile the mantissa converter 6 receives from the input register 2 the LSB H of the exponent and the 23-bit mantissa (a . . . w) expressed in an absolute value format, and converts these 24 bits to a mantissa (H' a' . . . w') in the two's complement format according to the value of the sign bit S (FIG. 5C). More specifically, the mantissa converter 6 outputs the 24 bits from the input register 2 as they are when the sign bit is "0" (positive), or converts the 24 bits from the input register 2 to 24 bits expressed in its two's complement when the sign bit is "1" (negative). Incidentally, the MSB H' of the converted data is irrelevant because it results from the conversion of the LSB of the exponent.

Figure 5D:
Figure 5E:
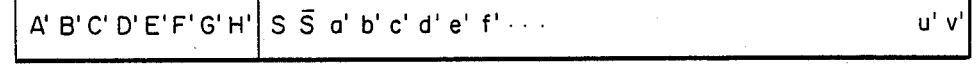

The shifter 7 shifts the output of the mantissa converter 6 rightward by one bit (FIG. 5D). This shifting is performed, because the mantissa is normalized and its MSB is omitted in the IEEE data format as described above, to supplement the omitted data. The MSB H" in the shifter 7 is an irrelevant data resulting from this shifting, and the second bit has been generated by the mantissa converter 6, so that these two bits (H"H') have to be replaced with correct bits. Since the second bit H" corresponds to the MSB "1" omitted in the IEEE standard format, it is "1" when S is "0" and, on the other hand, the first bit H' is "0" when S is "0". When S is "1", the second bit H" is "0" in the two's complement format, and H' is "1". The bit correcting circuit 8 corrects said first and second bits to "01" or to "10" in response to the value of the sign bit S, which may be either "0" or "1", to provide the 24-bit mantissa in the two's complement format (FIG. 5E).

Figure 6A:
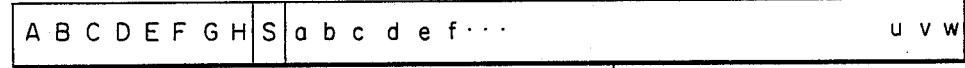
Figure 6B:
Figure 6C:
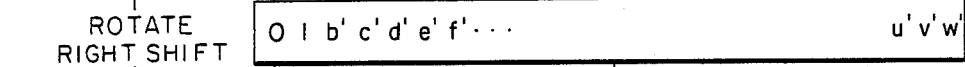
Figure 6D:
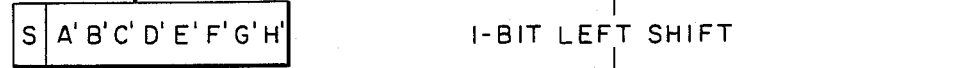

Next, T/I conversion will be described with reference to FIGS. 6A to 6F. A T/I conversion indicating signal is supplied from the control circuit 1 to the structural elements 3 to 8, and a two's complement 32-bit floating-point number or data is entered into the input register 2 (FIG. 6A). The shifter 3 receives the eight-bit exponent (A . . . H) from the input register 2, and supplies it unchanged to the A/S unit 4, which adds to it decimal 127 as a bias (FIG. 6B) and supplies the result of the addition (A' ... H') to the shifter 5. The shifter 5 receives the 8-bit result of addition and a 9th bit S of the input register as sign bit, and rotate-shifts these nine bits (A' ... H' S) rightward by one bit to provide an exponent (S A' ... H') in the IEEE standard format (FIG. 6D). The eight upper bits (S A' ... G') are supplied to the output register 9 (what is done with H' will be explained afterwards).

Figure 6E:
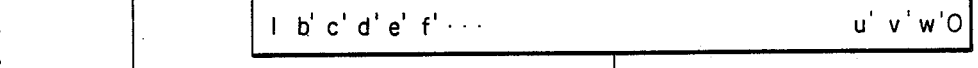

Meanwhile, the mantissa converter 6 receives 24 bits (S a ... w) from the input register 2, and computes the absolute value of this 24-bit number (01 b' ... w'). The MSB is "0" because the operation to figure out the absolute value makes the MSB of the two's complement format "0", and the second bit is "1" because, since the mantissa is normalized, the value of the mantissa in the two's complement format is predetermined so as to make the second bit of its absolute value "1". The shifter 7 shifts the absolute value (01 ... w') leftward by one bit so that "1" comes to the MSB (FIG. 6E).

Figure 6F:
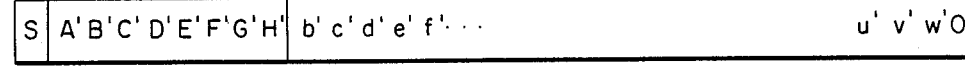

Since the MSB "1" of the shifted 24-bit absolute value (1 ... w') has been omitted, the bit correcting circuit 8 replaces this MSB with the LSB H' from the shifter 5, and supplies the resultant (H' b' ... w'0) to the output register 9 (FIG. 6F).

As hitherto described, a floating-point format converter according to the present invention makes it possible to achieve in a short period of time two-way conversion between two floating-point numbers or data equal to each other in overall word length and exponent word length but different from each other in the format of the exponent and the mantissa.

What is claimed is:

1. A floating-point format converter for format conversion between a first floating-point format data consisting of a sign bit, an e-bit biased exponent and an (m−1)-bit absolute-value mantissa and a second floating-point format data consisting of an e-bit two's complement exponent and an m-bit two's complement mantissa, said converter comprising:
   control signal generator means for generating a first control signal for indicating conversion from said first floating-point format data to said second floating-point format data;
   input register means for storing said first floating-point format data;
   first means, responsive to said first control signal, for generating a shifted exponent by rotate-shifting leftward by one bit the e+1 upper bits of said first floating-point format data;
   subtractor means, responsive to said first control signal, for generating a corrected exponent by subtracting a predetermined number from the e bits of said shifted exponent;
   second means, responsive to said first control signal, for generating a converted exponent of e+1 bits, including the least significant bit (LSB) of said shifted exponent and the bits of said corrected exponent;
   mantissa converter means, responsive to said first control signal and the value of the LSB of said shifted exponent, for converting the m lower bits of said first floating-point format data to a mantissa of the two's complement format;
   third means, responsive to said first control signal, for generating a shifted mantissa by shifting rightward by one bit the mantissa of said two's complement format; and
   bit correcting means, responsive to said first control signal and the value of the LSB of said shifted exponent, for generating a converted mantissa by correcting the two upper bits of said shifted mantissa.

2. A floating-point converter for format conversion between a first floating-point format data consisting of a sign bit, an e-bit biased exponent and an (m−1)-bit absolute-value mantissa and a second floating-point format data consisting of an e-bit two's complement exponent and an m-bit two's complement mantissa, said converter comprising:
   control signal generator means for generating a second control signal for indicating conversion from said second floating-point format data to said first floating-point format data;
   input register means for storing said second floating-point format data;
   first means, responsive to said second control signal, for generating a shifted exponent consisting of e+1 upper bits of said second floating-point format data;
   adder means, responsive to said second control signal, for generating a corrected exponent by adding a predetermined number to the e bits of said shifted exponent;
   second means, responsive to said second control signal, for generating a converted exponent by rotate-shifting rightward by one bit the e+1 bits, including the least significant bit (LSB) of said shifted exponent and the e bits of said corrected exponent;
   mantissa converter means, responsive to said second control signal, for converting the m lower bits of said second floating-point format data to an absolute value of the mantissa;
   third means, responsive to said second control signal, for generating a shifted mantissa by shifting leftward by one bit said absolute value of the mantissa; and
   bit correcting means, responsive to said second control signal, for generating a converted mantissa by replacing the most significant bit of said shifted mantissa with the value of the LSB of said converted exponent.

* * * * *